(12) United States Patent
Aso et al.

(10) Patent No.: US 9,408,333 B2
(45) Date of Patent: Aug. 2, 2016

(54) METHOD OF CONTROLLING ADSORPTION HEAT PUMP, INFORMATION PROCESSING SYSTEM, AND CONTROL DEVICE

(71) Applicant: FUJITSU LIMITED, Kawasaki-shi, Kanagawa (JP)

(72) Inventors: Noriyasu Aso, Isehara (JP); Toshio Manabe, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 261 days.

(21) Appl. No.: 14/132,216

(22) Filed: Dec. 18, 2013

(65) Prior Publication Data
US 2014/0102122 A1 Apr. 17, 2014

Related U.S. Application Data

(63) Continuation of application No. PCT/JP2011/065259, filed on Jul. 4, 2011.

(51) Int. Cl.
*F25B 15/00* (2006.01)
*H05K 7/20* (2006.01)
*F25B 17/08* (2006.01)
*F25B 49/04* (2006.01)

(52) U.S. Cl.
CPC .......... *H05K 7/20936* (2013.01); *F25B 17/083* (2013.01); *F25B 49/04* (2013.01); *F25B 49/046* (2013.01); *H05K 7/20363* (2013.01); *H05K 7/20836* (2013.01); *Y02B 30/64* (2013.01)

(58) Field of Classification Search
CPC ........ Y02B 30/62; F25B 15/10; F25B 49/005
USPC .......... 62/79, 101, 126, 190, 238.3, 476, 477
See application file for complete search history.

(56) References Cited

U.S. PATENT DOCUMENTS

| 4,341,084 A | * | 7/1982 | Rojey | ...................... F25B 15/02 62/101 |
| 4,724,697 A | * | 2/1988 | Hien | ...................... B21B 25/02 72/208 |
| 5,038,574 A | * | 8/1991 | Osborne | ................. F25B 15/06 62/101 |

FOREIGN PATENT DOCUMENTS

| JP | 64-7330 | 1/1989 |
| JP | 2006-147924 | 6/2006 |
| JP | 2007-157169 | 6/2007 |
| JP | 2009-224406 | 10/2009 |
| JP | 2011-64352 | 3/2011 |

OTHER PUBLICATIONS

International Search Report, mailed in connection with PCT/JP2011/065259 and mailed Sep. 20, 2011.
JPOA—Office Action of Japanese Patent Application No. 2013-522623 dated Apr. 28, 2015, with partial English translation.
CNOA—Office Action of Chinese Patent Application No. 201180072105.2 dated Mar. 11, 2015 with full English translation of the Office Action.
CNOA—Office Action [Second Office Action] of Chinese Patent Application No. 201180072105.2 dated Nov. 4, 2015, with full English translation of the Office Action.

* cited by examiner

*Primary Examiner* — Melvin Jones
(74) *Attorney, Agent, or Firm* — Fujitsu Patent Center

(57) ABSTRACT

There are provided: a flow-rate adjustment unit capable of individually adjusting the flow rates of a heating medium to be supplied to a plurality of electronic devices; a temperature sensor configured to individually detect the temperatures of the heating medium released from the plurality of electronic devices; and a control unit. The control unit controls the flow-rate adjustment unit based on outputs of the temperature sensor such that the temperatures of the heating medium released from the plurality of electronic devices become equal to each other.

19 Claims, 12 Drawing Sheets

FIG. 10

| FLOW RATE L/min | ΔT (°C) | | | SURFACE TEMPERATURE OF CPU (°C) | | Tj (°C) | |
|---|---|---|---|---|---|---|---|
| | CPU1 | CPU2 | SERVER | CPU1 | CPU2 | CPU1 | CPU2 |
| 0.7 | 1.2 | 1.2 | 2.4 | 59 | 61 | 75 | 76 |
| 1.0 | 0.9 | 1.0 | 1.9 | 59 | 61 | 74 | 75 |
| 1.3 | 0.6 | 0.8 | 1.4 | 59 | 61 | 72 | 72 |
| 1.6 | 0.5 | 0.6 | 1.1 | 59 | 60 | 72 | 74 |

FIG. 11

| | LOAD ON CPU (%) | TOTAL OUTPUT OF HEATERS (W) | FLOW RATE (L/min) | | | | | TEMPERATURE (°C) | | |
| --- | --- | --- | --- | --- | --- | --- | --- | --- | --- | --- |
| | | | ADSORBER (HOT WATER) | | ADSORBER (COOLING WATER) | CONDENSER (COOLING WATER) | EVAPORATER (COOLING WATER) | TARGET TEMPERATURE $T_H$ | COOLING WATER $T_M$ | COOLING WATER $T_L$ |
| | | | SERVER | DUMMY SERVER 1 / DUMMY SERVER 2 | | | | | | |
| CASE 1 | 100 | 460 | 1.0 | 1.5 / 1.5 | 4.3 | 4.9 | 2.0 | 55 | 25 | 18 |
| CASE 2 | 100 | 360 | 1.0 | 1.2 / 1.2 | 4.3 | 4.9 | 2.0 | 55 | 25 | 18 |
| CASE 3 | 100 | 270 | 1.0 | 0.9 / 0.9 | 4.3 | 4.9 | 2.0 | 55 | 25 | 18 |

|  | CASE 1 | CASE 2 | CASE 3 |
|---|---|---|---|
| TOTAL COOLING OUTPUT (ONE CYCLE) kJ | 332 | 398 | 437 |
| COP | 0.57 | 0.59 | 0.57 |

METHOD OF CONTROLLING ADSORPTION HEAT PUMP, INFORMATION PROCESSING SYSTEM, AND CONTROL DEVICE

CROSS-REFERENCE TO RELATED APPLICATION

This application is a continuation of International Patent Application No. PCT/JP2011/065259 filed Jul. 4, 2011 and designated the U.S., the entire contents of which are incorporated herein by reference.

FIELD

The embodiments discussed herein are related to a method of controlling an adsorption heat pump, an information processing system, and a control device.

BACKGROUND

In recent years, calculators have been used to handle a large amount of data with the advent of advanced information societies. In facilities such as a datacenter, a large number of calculators are often placed in a single room and managed collectively. For example, in a datacenter, many racks (server racks) are placed in a calculator room, and a plurality of calculators (servers) are housed in each rack. Moreover, jobs are organically distributed to the calculators according to the states of operation of the calculators to thereby process a large amount of jobs efficiently.

Calculators generate a large amount of heat when the calculators operate. Since high temperature inside a calculator may be a cause of malfunction or failure, it is important to cool the calculator. For this reason, a datacenter usually uses fans (air blowers) to discharge heat generated by calculators to the outside their racks, and also uses air-conditioning apparatus to adjust the temperature of the room.

Meanwhile, it has been said that the power consumption for air conditioning equipment accounts for approximately 40% of the whole electric power consumption of a datacenter. In view of this, for example, using an adsorption heat pump (AHP) to collect heat generated from calculators and reuse the heat has been proposed.

Patent Document 1: Japanese Laid-open Patent Publication No. 2006-147924
Patent Document 2: Japanese Laid-open Patent Publication No. 2009-224406

SUMMARY

One aspect of the disclosed technique provides a method of controlling an adsorption heat pump for merging a heating medium released from a plurality of electronic devices and supplying the heating medium to the adsorption heat pump, the method including: providing a flow-rate adjustment unit capable of individually adjusting flow rates of the heating medium to be supplied to the plurality of electronic devices, a temperature sensor configured to individually detect temperatures of the heating medium released from the plurality of electronic devices, and a control unit; and causing the control unit to control the flow-rate adjustment unit based on outputs of the temperature sensor such that the temperatures of the heating medium released from the plurality of electronic devices become equal to each other.

Another aspect of the disclosed technique provides an information processing system including: a transfer pump configured to transfer a heating medium; a branching portion at which a flow path of the heating medium transferred from the transfer pump branches off; a merging portion at which the flow paths branching off at the branching portion merge together; a plurality of electronic devices each disposed between the branching portion and the merging portion and having a heating-medium flow path through which the heating medium flows; an adsorption heat pump to which the heating medium after the merging at the merging portion is supplied; a flow-rate adjustment unit capable of individually adjusting flow rates of the heating medium to be supplied to the plurality of electronic devices; a temperature sensor configured to individually detect temperatures of the heating medium released from the plurality of electronic devices; and a control unit configured to receive signals from the temperature sensor and control the flow-rate adjustment unit such that the temperatures of the heating medium released from the plurality of electronic devices become equal to each other.

Still another aspect of the disclosed technique provides a control device of an information processing system, the information processing system including: a transfer pump configured to transfer a heating medium; a branching portion at which a flow path of the heating medium transferred from the transfer pump branches off; a merging portion at which the flow paths branching off at the branching portion merge together; a plurality of electronic devices each disposed between the branching portion and the merging portion and having a heating-medium flow path through which the heating medium flows; an adsorption heat pump to which the heating medium after the merging at the merging portion is supplied; a flow-rate adjustment unit capable of individually adjusting flow rates of the heating medium to be supplied to the plurality of electronic devices; and a temperature sensor configured to individually detect temperatures of the heating medium released from the plurality of electronic devices, wherein the control device receives signals from the temperature sensor and controls the flow-rate adjustment unit such that the temperatures of the heating medium released from the plurality of electronic devices become equal to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 is a diagram illustrating a result obtained by studying a condition under which any of junction temperatures Tj of CPUs of a server does not exceed the upper limit value (75° C.) with the loads on the CPUs being set to 100%;

FIG. 11 is a diagram illustrating test conditions in Cases 1 to 3 altogether;

DESCRIPTION OF EMBODIMENTS

Hereinbelow, before describing an embodiment, a prelude for facilitating understanding of the embodiment will be described.

Figure 1:
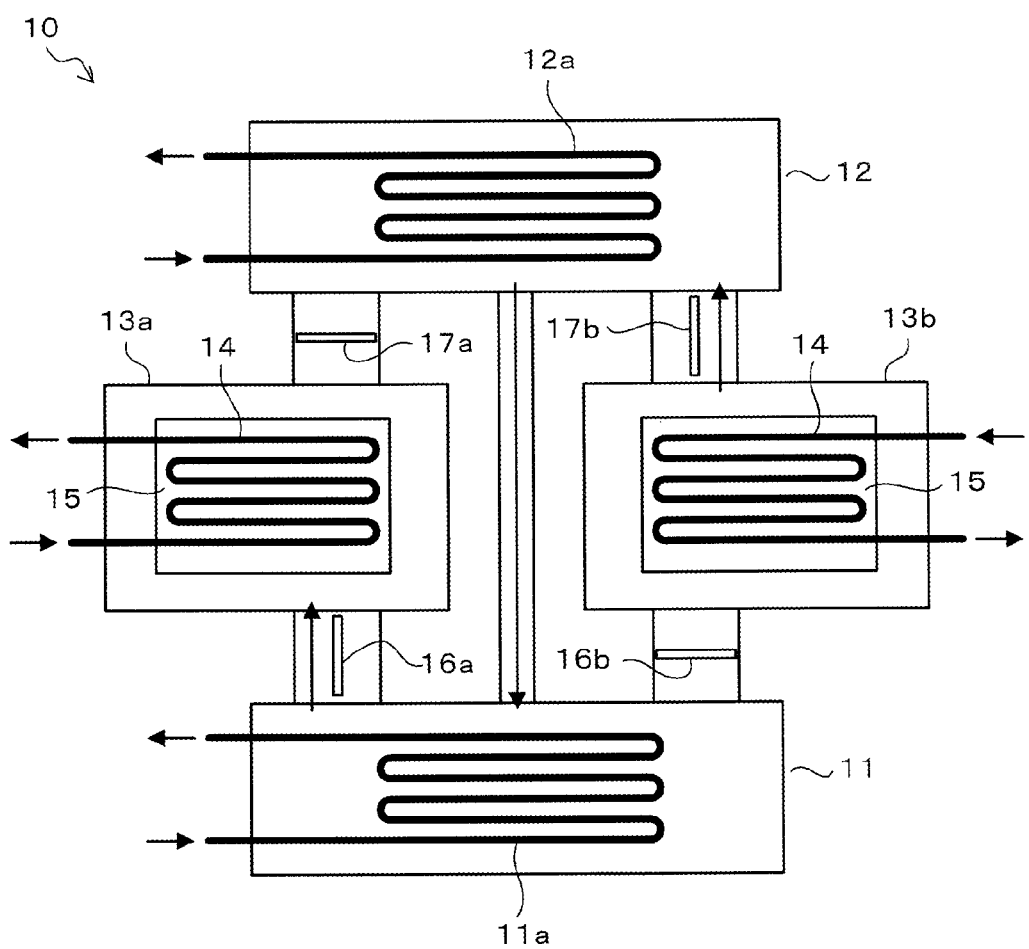
FIG. 1 is a schematic diagram illustrating an example of an adsorption heat pump.

FIG. 1 is a schematic diagram illustrating an example of an adsorption heat pump.

As illustrated in FIG. 1, the adsorption heat pump 10 includes an evaporator 11, a condenser 12 disposed above the evaporator 11, and adsorbers 13a and 13b disposed in parallel between the evaporator 11 and the condenser 12. The space inside the adsorption heat pump 10 is depressurized to around 1/100 of atmospheric pressure, for example.

In the evaporator 11, there are provided a cooling-water coil pipe 11a through which cooling water flows and a spray nozzle (not illustrated) which sprays a liquid cooling medium (e.g. water) toward the cooling-water coil pipe 11a.

A heat transfer pipe 14 and adsorbent (desiccant) 15 are provided inside each of the adsorbers 13a and 13b. Moreover, an on-off valve 16a is disposed between the adsorber 13a and the evaporator 11, and an on-off valve 16b is disposed between the adsorber 13b and the evaporator 11. Note that activated carbon, silica gel, zeolite, or the like is used as the adsorbent 15, for example.

A cooling-water coil pipe 12a through which cooling water flows is provided in the condenser 12. An on-off valve 17a is disposed between the condenser 12 and the adsorber 13a, and an on-off valve 17b is disposed between the condenser 12 and the adsorber 13b.

Hereinbelow, the operation of the above-described adsorption heat pump 10 will be described.

Here, assume that in an initial state, the on-off valve 16a between the evaporator 11 and the adsorber 13a, and the on-off valve 17b between the adsorber 13b and the condenser 12 are both open. Moreover, assume that the on-off valve 16b between the evaporator 11 and the adsorber 13b, and the on-off valve 17a between the adsorber 13a and the condenser 12 are both closed.

Further, assume that cooling water is supplied to the heat transfer pipe 14 of one adsorber 13a, whereas hot water heated by heat released from electronic devices is supplied to the heat transfer pipe 14 of the other adsorber 13b. Furthermore, assume that water is used as the cooling medium to be sprayed inside the evaporator 11.

Since the inside of the evaporator 11 is depressurized, when water (liquid cooling medium) is sprayed onto the cooling-water coil pipe 11a of the evaporator 11, the water easily evaporates around the cooling-water coil pipe 11a, thereby removing latent heat from the cooling-water coil pipe 11a. As a result, the temperature of water flowing inside the cooling-water coil pipe 11a is lowered, and low-temperature cooling water is released from the cooling-water coil pipe 11a. This cooling water is used for air conditioning of a room or cooling of electronic devices, power supplies, etc., for example.

The water vapor (gaseous cooling medium) produced in the evaporator 11 enters the adsorber 13a through the opened on-off valve 16a. The water vapor is then cooled by cooling water flowing inside the heat transfer pipe 14, thereby turning back into liquid, and is adsorbed to the adsorbent 15 of the adsorber 13a.

While one adsorber 13a operates in an adsorption cycle of adsorbing the cooling medium (water vapor) to its adsorbent 15, the other adsorber 13b operates in a regeneration cycle of regenerating (drying) its adsorbent 15. Specifically, in the adsorber 13b, the cooling medium (water) adsorbed to the adsorbent 15 is heated by the hot water flowing inside the heat transfer pipe 14, thereby turning into gas (water vapor), and desorbs from the adsorbent 15. The cooling medium having desorbed from the adsorbent 15 enters the condenser 12 through the opened on-off valve 17b.

Cooling water is supplied to the cooling-water coil pipe 12a in the condenser 12. Cooling water released from the adsorber 13a may be used as this cooling water. The water vapor (gaseous cooling medium) having entered the condenser 12 from the adsorber 13b is condensed around the cooling-water coil pipe 12a and turns into liquid. This liquid is transferred to the evaporator 11 by means of a pump (not illustrated) and sprayed onto the cooling-water coil pipe 11a.

The adsorbers 13a and 13b each operate in an adsorption cycle and a regeneration cycle at a predetermined interval. In other words, the on-off valves 16a, 16b, 17a, and 17b repeat opening and closing actions at the predetermined interval, so that cooling water and hot water are supplied alternately to each of the heat transfer pipes 14 of the adsorbers 13a and 13b. The adsorption heat pump 10 operates continuously in this manner.

Meanwhile, in the case where cooling water after cooling electronic devices such as calculators is supplied as hot water to the adsorber 13a or 13b, the temperature of the hot water greatly varies depending upon the states of operation of the electronic devices. For this reason, in the case of a method in which the adsorption cycle and the regeneration cycle are simply switched at a predetermined interval as described above, a shift to the adsorption cycle may possibly occur before the adsorbent 15 is sufficiently regenerated, or conversely a shift to the adsorption cycle may possibly fail to occur even after the regeneration of the adsorbent 15 is completed. This results in decrease in the efficiency of operation of the adsorption heat pump 10.

The following embodiment will describe a method of controlling an adsorption heat pump which may allow efficient operation even when the temperatures of heat sources to which hot water (heating medium) is supplied vary greatly.

Embodiment

Figure 2:
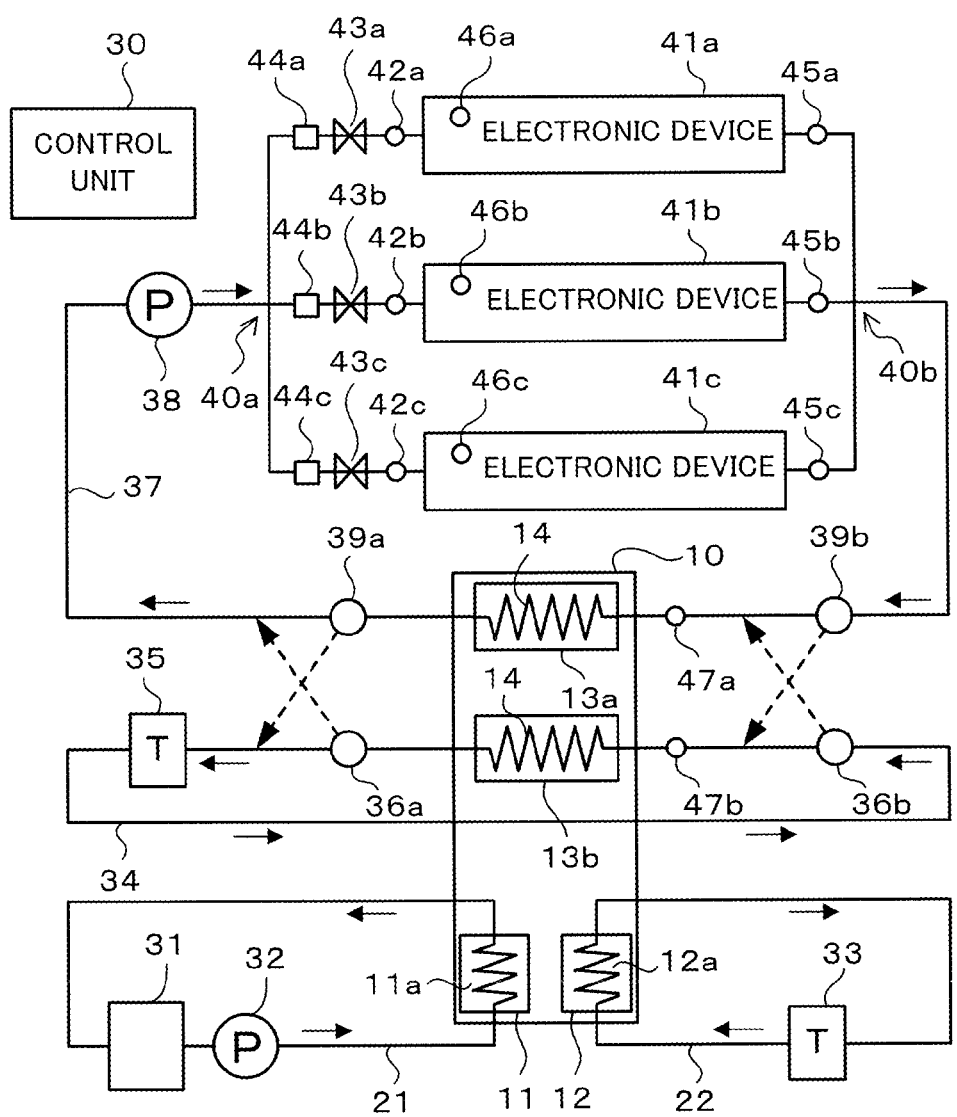
FIG. 2 is a schematic diagram describing a method of controlling an adsorption heat pump according to an embodiment.

FIG. 2 is a schematic diagram describing a method of controlling an adsorption heat pump according to an embodiment. Note that this embodiment will be described also by referring to FIG. 1.

As illustrated in FIG. 1, an adsorption heat pump 10 includes an evaporator 11, a condenser 12, and adsorbers 13a and 13b. A cooling-water coil pipe 11a is disposed in the evaporator 11, and a cooling-water coil pipe 12a is disposed in the condenser 12. Moreover, a heat transfer pipe 14 and adsorbent 15 are disposed in each of the adsorbers 13a and 13b.

As illustrated in FIG. 2, the cooling-water coil pipe 11a of the evaporator 11 of the adsorption heat pump 10 is connected to an evaporator-cooling-water flow path 21. This evaporator-cooling-water flow path 21 is provided with a cooling-water storage tank 31 in which cooling water is stored, and a pump 32 which circulates the cooling water between the cooling-water storage tank 31 and the evaporator 11. The cooling water stored in the cooling-water storage tank 31 is used for air conditioning of a room or cooling of electronic devices, power supplies, etc., for example.

The cooling-water coil pipe 12a of the condenser 12 is connected to a condenser-cooling-water flow path 22. This condenser-cooling-water flow path 22 is provided with a chiller unit 33 which circulates cooling water between the condenser 12 and itself while maintaining the temperature of the cooling water at a predetermined temperature at the same time.

An adsorber-cooling-water flow path 34 is a flow path through which cooling water is supplied to the adsorber 13a or 13b. This adsorber-cooling-water flow path 34 is provided with a chiller unit 35 which transfers the cooling water while maintaining the temperature of the cooling water constant at the same time.

The adsorber-cooling-water flow path 34 is also provided with switch valves 36a and 36b. These switch valves 36a and 36b operate in response to a signal from a control unit 30 and switch the flow path of the cooling water such that it flows through one of the adsorbers 13a and 13b and returns to the chiller unit 35.

An electronic-device-cooling-water flow path 37 is a flow path through which the cooling water (hot water), the temperature of which is raised as a result of cooling electronic devices 41a, 41b, and 41c, is supplied to the adsorber 13a or 13b. This electronic-device-cooling-water flow path 37 is provided with a pump 38 and switch valves 39a and 39b.

Hereinafter, the cooling water flowing in the electronic-device-cooling-water flow path 37 will also be referred to as the heating medium for the sake of explanation. Note that a liquid other than water may be used as the heating medium.

The heating medium discharged from the pump 38 branches off at a branching portion 40a and flows through the inside of the plurality (three in FIG. 2) of electronic devices 41a, 41b, and 41c to thereby cool the electronic devices 41a, 41b, and 41c. The heating medium (hot water), the temperatures of which are raised as a result of cooling the electronic devices 41a, 41b, and 41c, is released from the electronic devices 41a, 41b, and 41c and merge at a merging portion 40b.

This embodiment assumes each of the electronic devices 41a, 41b, and 41c as a calculator (information processing device). Moreover, this embodiment assumes that each of the electronic devices 41a, 41b, and 41c is equipped with one or more CPUs (Central Processing Units), to each of which a cold plate is mounted, and the heating medium flows through the inside of the cold plate. The CPUs are merely exemplary semiconductor components; other semiconductor components or other electronic components may be cooled by the heating medium.

The switch valves 39a and 39b operate in response to a signal from the control unit 30 and switch the flow path of the heating medium after the merging at the merging portion 40b, such that the heating medium flows through one of the adsorbers 13a and 13b and returns to the pump 38.

The switch valves 36a and 36b of the adsorber-cooling-water flow path 34 and the switch valves 39a and 39b of the electronic-device-cooling-water flow path 37 are driven in an exclusive manner. Specifically, while the adsorber 13a is connected to the adsorber-cooling-water flow path 34, the adsorber 13b is connected to the electronic-device-cooling-water flow path 37, and while the adsorber 13a is connected to the electronic-device-cooling-water flow path 37, the adsorber 13b is connected to the adsorber-cooling-water flow path 34.

Note that the control unit 30 switches the on-off valves 16a, 16b, 17a, and 17b in the adsorption heat pump 10 at the same time as the switching of the switch valves 36a, 36b, 39a, and 39b.

Meanwhile, in this embodiment, the cooling water flowing through the condenser 12 is cooled by the chiller unit 33, but the cooling water released from the adsorber currently operating in the adsorption cycle (adsorber 13a or 13b) may be caused to flow through the condenser 12 and return to the chiller unit 35.

Temperature sensors 42a, 42b, and 42c, flow-rate adjustment valves (proportional control valves) 43a, 43b, and 43c, and flow meters 44a, 44b, and 44c are provided at the heating-medium inlet sides of the electronic devices 41a, 41b, and 41c, respectively. Note that pumps each capable of flow rate adjustment may be disposed in place of the flow-rate adjustment valves 43a, 43b, and 43c.

The measured temperature values of the heating medium obtained by the temperature sensors 42a, 42b, and 42c and the measured flow-rate values of the heating medium obtained by the flow meters 44a, 44b, and 44c are transmitted to the control unit 30. Moreover, the flow-rate adjustment valves 43a, 43b, and 43c change their opening degrees in response to signals from the control unit 30. The heating medium flows through the electronic devices 41a, 41b, and 41c at the flow rates corresponding to the opening degrees of the flow-rate adjustment valves 43a, 43b, and 43c.

Temperature sensors 45a, 45b, and 45c are disposed at the heating-medium outlet sides of the electronic devices 41a, 41b, and 41c, respectively. The measured temperature values obtained by these temperature sensors 45a, 45b, and 45c are also transmitted to the control unit 30.

The CPUs of the electronic devices 41a, 41b, and 41c incorporate temperature sensors 46a, 46b, and 46c which detect their junction temperatures, respectively. The measured values of the junction temperatures obtained by the temperature sensors 46a, 46b, and 46c are also transmitted to the control unit 30. Note that temperature sensors may be mounted on the surfaces of the CPUs in place of the temperature sensors 46a, 46b, and 46c incorporated in the CPUs.

Further, in this embodiment, temperature sensors 47a and 47b which detect the temperatures of the heating medium to be supplied to the heat transfer pipes 14 of the adsorbers 13a and 13b are provided at inlet portions of the heat transfer pipes 14, respectively. The measured temperature values obtained by these temperature sensors 47a and 47b are also transmitted to the control unit 30.

Hereinbelow, the method of controlling an adsorption heat pump according to this embodiment will be described.

Figure 3:
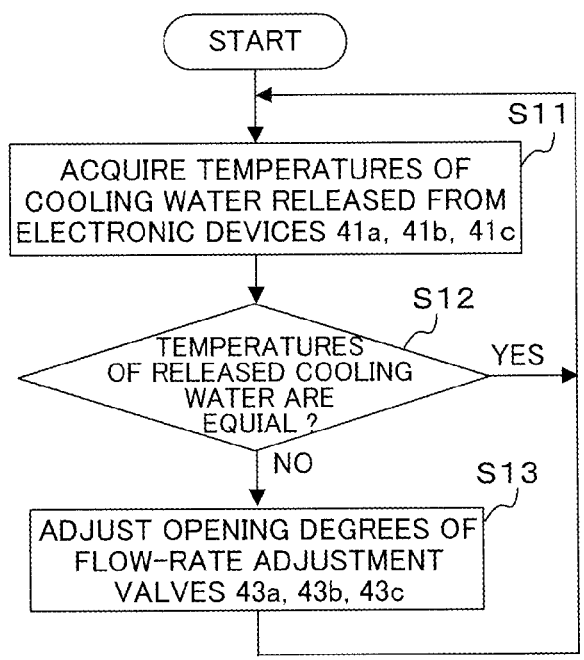
FIG. 3 is a flowchart describing a process for adjusting the flow rates of cooling water flowing into electronic devices according to the temperatures of the heating medium released from the electronic devices.
Figure 4:
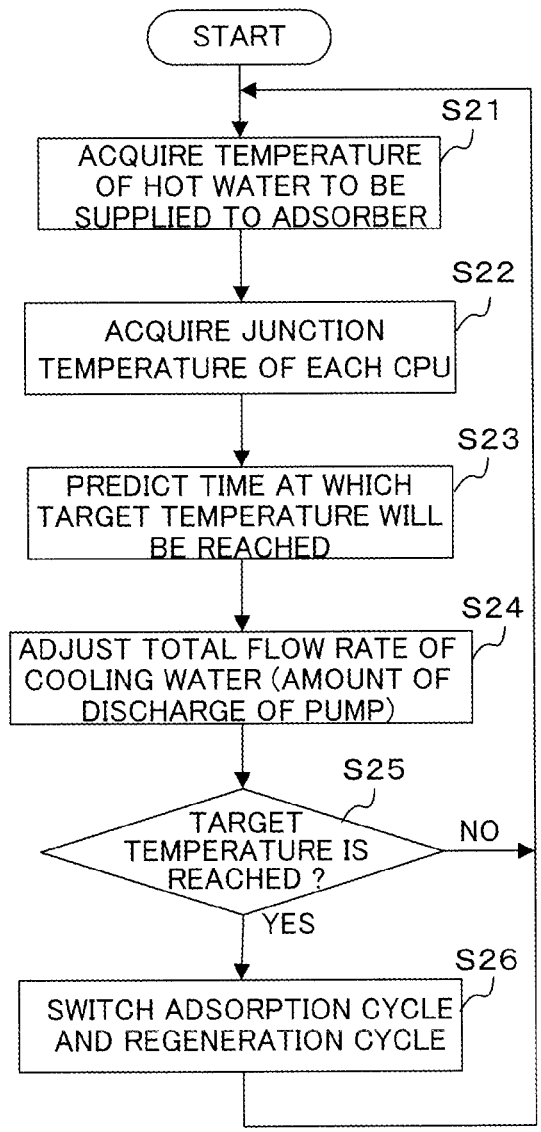
FIG. 4 is a flowchart describing a process for switching an adsorption cycle and a regeneration cycle according to the temperature of the heating medium (hot water) to be supplied to an adsorber.

The control unit 30 simultaneously executes processes, which are exemplarily illustrated in FIGS. 3 and 4, according to the temperatures of the heating medium (hot water) released from the electronic devices 41a, 41b, and 41c, and the temperature of the heating medium to be supplied to the adsorber 13a or 13b.

FIG. 3 is a flowchart describing a process for adjusting the flow rates of the cooling water flowing into the electronic devices 41a, 41b, and 41c according to the temperatures of the heating medium released from the electronic devices 41a, 41b, and 41c.

Assume that in an initial state, the adsorber 13a is connected to the electronic-device-cooling-water flow path 37 through the switch valves 39a and 39b, and the adsorber 13b is connected to the adsorber-cooling-water flow path 34 through the switch valves 36a and 36b.

First, in step S11, the control unit 30 acquires the temperatures of the heating medium released from the electronic devices 41a, 41b, and 41c, i.e. the measured temperature values obtained by the temperature sensors 45a, 45b, and 45c.

Then, the control unit 30 proceeds to step S12, where it determines whether or not the temperatures of the heating medium released from the electronic devices 41a, 41b, and 41c are the same. The control unit 30 returns to step S11 and continues the process if the temperatures of the heating medium released from the electronic devices 41a, 41b, and 41c are equal.

On the other hand, the control unit 30 proceeds to step S13 if determining in step S12 that the temperatures of the heating medium released from the electronic devices 41a, 41b, and 41c are not equal. In step S13, the control unit 30 adjusts the opening degrees of the flow-rate adjustment valves 43a, 43b, and 43c such that the temperatures of the heating medium released from the electronic devices 41a, 41b, and 41c become equal.

In this embodiment, when adjusting the opening degrees of the flow-rate adjustment valves 43a, 43b, and 43c, the control unit 30 determines the opening degrees of the flow-rate adjustment valves 43a, 43b, and 43c based on the flow rate of the heating medium in the electronic device that releases the hottest heating medium.

For example, assume a case where the temperature of the heating medium released from the electronic device 41a is higher than the temperatures of the heating medium released from the other electronic devices 41b and 41c, provided that the opening degrees of the flow-rate adjustment valves 43a, 43b, 43c are equal. In this case, the control unit 30 adjusts the opening degrees of the other flow-rate adjustment valves 43b and 43c such that the temperatures of the heating medium released from the flow-rate adjustment valves 43b and 43c become equal to the temperature of the heating medium released from the electronic device 41a.

After adjusting the opening degrees of the flow-rate adjustment valves 43a, 43b, and 43c in this manner, the control unit 30 returns to step S11 and repeats the above-described process.

FIG. 4 is a flowchart describing a process for switching the adsorption cycle and the regeneration cycle according to the temperature of the heating medium (hot water) to be supplied to the adsorber 13a or 13b.

First, in step S21, the control unit 30 acquires the temperature of the heating medium to be supplied to the adsorber 13a, which is currently operating in the regeneration cycle, from the temperature sensor 47a.

Then, in step S22, the control unit 30 acquires the junction temperatures of the CPUs, i.e. the measured temperature values obtained by the temperature sensors 46a, 46b, and 46c.

Then, the control unit 30 proceeds to step S23, where it predicts the time at which the temperature of the heating medium to be supplied to the adsorber 13a reaches a preset target temperature (hereinafter, referred to as "target reaching time"). Note that the target temperature is a temperature for the regeneration of the adsorbent 15 and is set according to the type of the adsorbent 15.

In this embodiment, a database is used to predict the target reaching time. As will be described in Example to be discussed later, this database is prepared to include associations between target reaching times and CPU loads, CPU junction temperatures (or surface temperatures), heating-medium flow rates and heating-medium temperatures. For example, the control unit 30 selects the CPU with the highest load among the loads on the CPUs installed in the electronic devices 41a, 41b, and 41c, and then refers to the database and predicts the target reaching time based on the load on that CPU.

Then, the control unit 30 proceeds to step S24, where it adjusts the amount of discharge of the pump 38 (the total flow rate of the heating medium) such that the temperature of the heating medium to be supplied to the adsorber 13a reaches the target temperature at the target reaching time without increasing the junction temperatures of all the CPUs above the upper limit value mentioned above. The control unit 30 refers to the aforementioned database for the adjustment of the amount of discharge of the pump 38.

Then, the control unit 30 proceeds to step S25, where it determines whether or not the temperature of the heating medium to be supplied to the adsorber 13a has reached the target temperature. Then, if determining the temperature has not yet reached the target temperature, the control unit 30 returns to step S21 and continues the process.

On the other hand, if determining in step S25 that the temperature has reached the target temperature, the control unit 30 proceeds to step S26. Then, in step S26, the control unit 30 drives the on-off valves 16a, 16b, 17a, and 17b and the switch valves 36a, 36b, 39a, and 39b to switch the adsorption cycle and the regeneration cycle. Thereafter, the control unit 30 returns to step S21 and repeats the process described above.

Note that by using the database, the junction temperature and the surface temperature of each CPU may be estimated from the flow rate and the temperature of the heating medium. Thus, it may be also possible to switch the adsorption cycle and the regeneration cycle by measuring the flow rate and the temperature of the heating medium in each flow path, without directly measuring the junction temperature and the surface temperature of the CPU.

Figure 5:
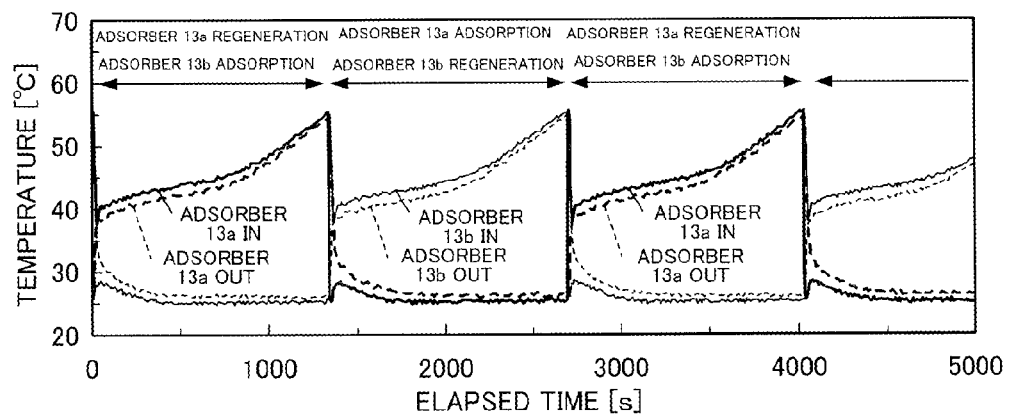
FIG. 5 is a diagram illustrating changes in the temperature of the heating medium over time at the inlet side and the outlet side of each adsorber.

FIG. 5 is a diagram with time on the horizontal axis and temperature on the vertical axis, illustrating changes in the temperature of the heating medium over time at the inlet side (IN) and the outlet side (OUT) of each of the adsorbers 13a and 13b.

At each moment when the cycle is switched from the adsorption cycle to the regeneration cycle, low-temperature cooling water supplied from the chiller unit 35 is still remaining inside the heat transfer pipe 14 of the adsorber (adsorber 13a or 13b). Hence, relatively low-temperature heating medium (cooling water) is supplied to the electronic devices 41a to 41d.

As this heating medium circulates between the electronic devices 41a to 41d and the adsorption heat pump (adsorber 13a or 13b), the heating medium is heated by the CPUs (heat sources) in the electronic devices 41a to 41d and thus its temperature increases gradually. Then, when the temperature of the heating medium reaches the target temperature (55° C. in this example), the regeneration cycle and the adsorption cycle are switched.

Figure 6:
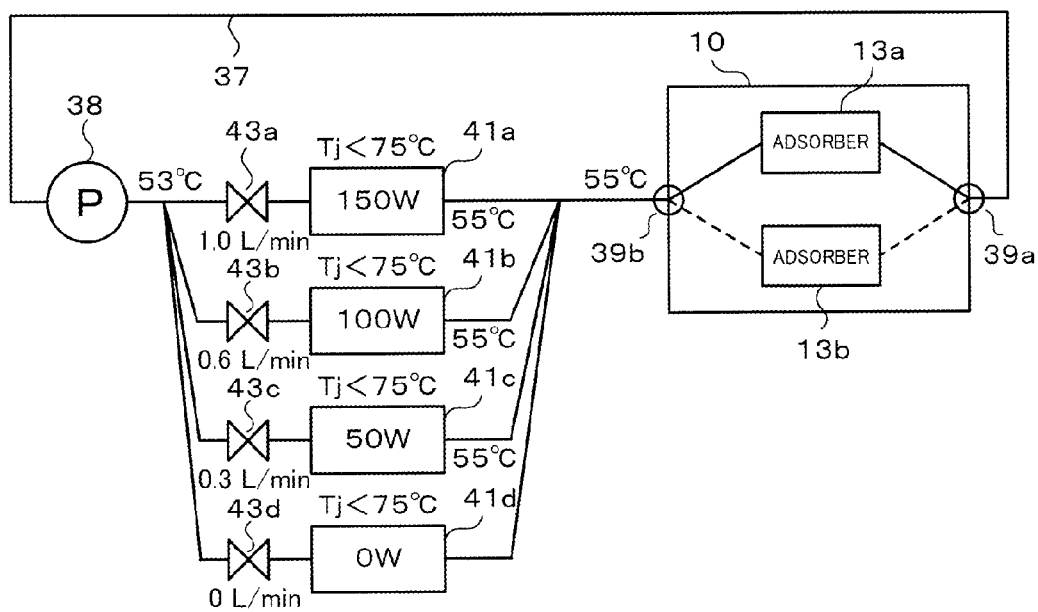
FIG. 6 is a diagram illustrating an outline of the method of controlling an adsorption heat pump according to the embodiment.

FIG. 6 is a diagram illustrating an outline of the method of controlling an adsorption heat pump according to this embodiment. Here, for the sake of explanation, assume that four electronic devices 41a to 41d are disposed in the electronic-device-cooling-water flow path 37 and that flow-rate adjustment valves 43a to 43d are disposed at the heating-medium inlet sides of these electronic devices 41a to 41d, respectively.

In this embodiment, the opening degrees of the flow-rate adjustment valves 43a to 43d and the flow rate of the pump 38 are adjusted such that junction temperature Tj of each CPU becomes the upper limit value (75° C. in this example) or lower and the temperatures of the heating medium (hot water) at the heating-medium outlet sides of the electronic devices 41a to 41d become equal.

Here, as illustrated in FIG. 6, assume that the amount of power consumption of the electronic device 41a is 150 W, the amount of power consumption of the electronic device 41b is 100 W, the amount of power consumption of the electronic device 41c is 50 W, and the amount of power consumption of the electronic device 41d is 0 W. The amount of power consumption of each of the electronic devices 41a to 41d is correlated to its CPU load; the higher the CPU load, the greater the amount of power consumption becomes. Each of the electronic devices 41a to 41d generates heat in proportion to the amount of its power consumption.

Assume also that the flow rate of the heating medium flowing into the electronic device 41a is 1.0 L (litter)/min, the flow rate of the heating medium flowing into the electronic device 41b is 0.6 L/min, the flow rate of the heating medium flowing into the electronic device 41c is 0.3 L/min, and the flow rate of the heating medium flowing into the electronic device 41d is 0 L/min.

Note that in this embodiment, in the case where there is any electronic device not in operation (the electronic device 41d in this example) as exemplarily illustrated in FIG. 6, the temperature of the cooling water is the same at the inlet side and the outlet side of that electronic device, and thus the flow-rate adjustment valve therefor is caused to gradually reduce its opening degree and finally close.

In this embodiment, as exemplarily illustrated in FIG. 6, the temperatures of the heating medium released from the electronic devices in operation are made equal by reducing the flow rate of the cooling water to a greater extent for electronic devices with smaller amounts of power consumption. Accordingly, it may be possible to suppress decrease in the temperature of the heating medium to be supplied to the adsorption heat pump 10. Moreover, in this embodiment, the amount of discharge of the pump 38 is adjusted without increasing the junction temperature of each CPU above the upper limit value. Thus, it may be possible to avoid malfunction and failure of the CPU.

Figure 7:
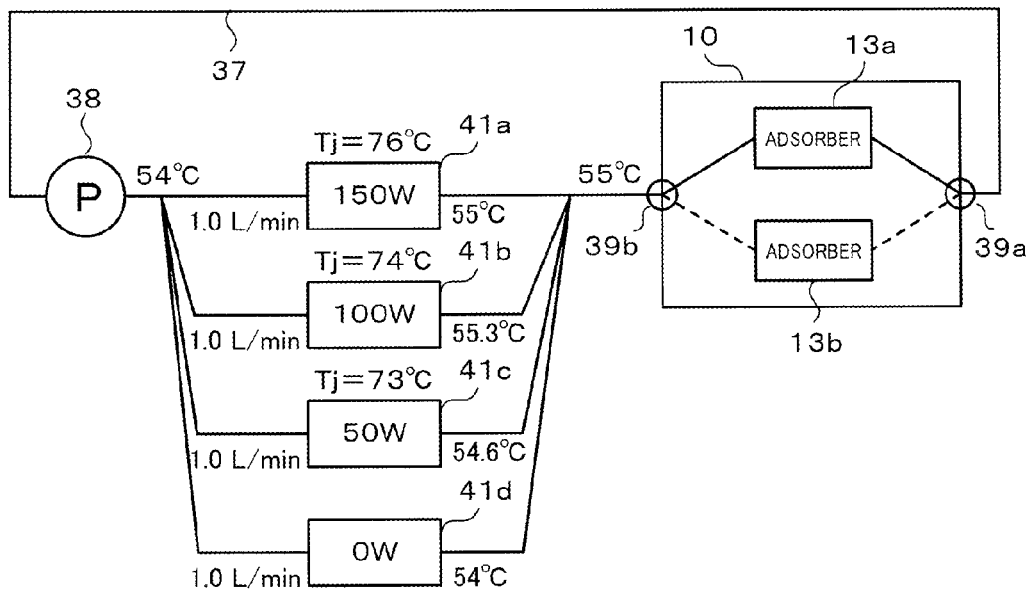
FIG. 7 is a diagram describing a problem that occurs in the case where the flow rates of the heating medium flowing into the electronic devices are equal.

FIG. 7 is a diagram describing a problem that occurs in the case where the flow rates of the heating medium flowing into the electronic devices 41a to 41d are equal. Here, assume that the adsorption cycle and the regeneration cycle are switched when the temperature of the heating medium to be supplied to the adsorption heat pump 10 reaches 55° C., as in the case of FIG. 6.

As exemplarily illustrated in FIG. 7, when the flow rates of the heating medium flowing into the electronic devices 41a to 41d are equal, the temperatures of the heating medium released from the electronic devices 41a to 41d are dependent on the states of operation of the electronic devices 41a to 41d. In this case, if the adsorption cycle and the regeneration cycle are not to be switched until the temperature of the heating medium to be supplied to the adsorption heat pump 10 reaches 55° C., the junction temperature of the CPU in any electronic device with a high CPU load (the electronic device 41a in the example of FIG. 7) may possibly exceed the upper limit value (75° C.)

Figure 8:
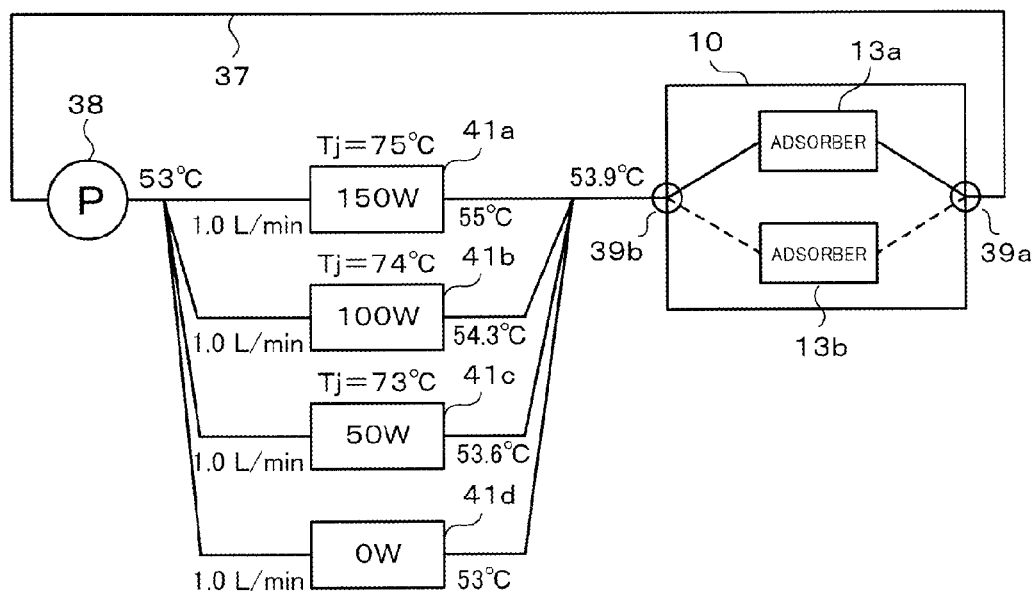
FIG. 8 is a diagram describing a problem that occurs in the case where the adsorption cycle and the regeneration cycle are switched when the junction temperature of any CPU reaches an upper limit value.

FIG. 8 is a diagram describing a problem that occurs in the case where the adsorption cycle and the regeneration cycle are switched when the junction temperature of any CPU reaches the upper limit value.

In the example of FIG. 8, the adsorption cycle and the regeneration cycle are switched when the flow rates of the heating medium flowing into the electronic devices 41a to 41d are equal (1.0 L/min), and the junction temperature of at least one of the plurality of CPUs reaches the upper limit value (75° C.). In this case, the adsorption cycle and the regeneration cycle may possibly be switched before the temperature of the heating medium to be supplied to the adsorption heat pump 10 is sufficiently raised.

For instance, in the example of FIG. 8, the temperature of the heating medium to be supplied to the adsorption heat pump 10 when the junction temperature Tj of the CPU of the electronic device 41a reaches 75° C., is 53.9° C. With this temperature, the adsorbent inside the adsorber 13a or 13b is not perhaps regenerated (dried) sufficiently.

Example

Hereinbelow, description will be given of the result of a test in which effects of the method of controlling an adsorption heat pump according to the embodiment are observed.

Figure 9:
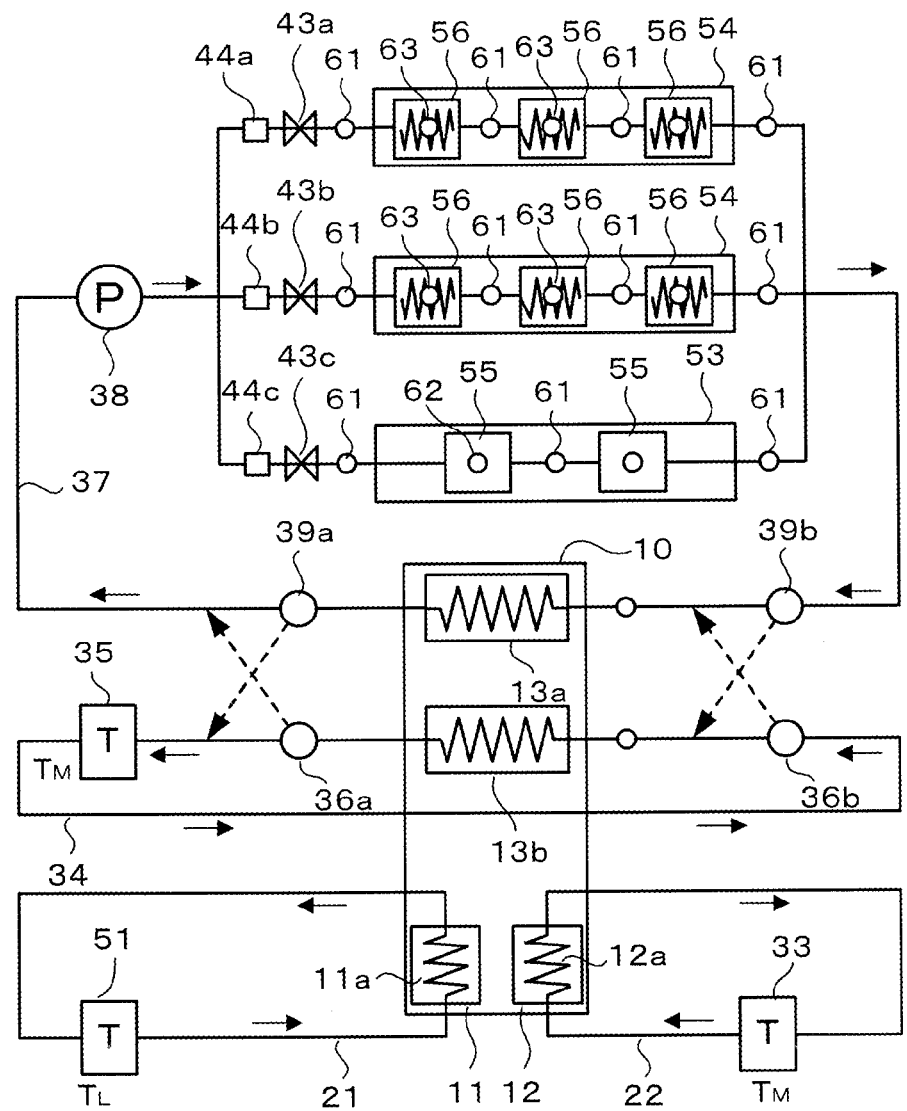
FIG. 9 is a diagram describing a schematic configuration of an apparatus used in a test.

FIG. 9 is a diagram describing a schematic configuration of an apparatus used in the test. In FIG. 9, the same components as those in FIG. 2 are denoted by the same reference numerals. In the evaporator-cooling-water flow path 21, a chiller unit 51 is disposed in place of the cooling-water storage tank 31 and the pump 32 exemplarily illustrated in FIG. 2. Preset temperature $T_L$ of the chiller 51 is 18° C., and preset temperature $T_M$ of each of the chiller units 33 and 35 is 25° C.

Moreover, in the test, one server 53 (RX300 S6 manufactured by Fujitsu Limited) and two dummy servers 54 are used as electronic devices. The server 53 is equipped with two CPUs 55 each with a cold plate mounted thereto, and a heating medium is caused to flow through the cold plates sequentially and be released to the outside of the server 53. A temperature sensor 61 which measures the temperature of the heating medium is disposed at each of the heating-medium inlet side and outlet side of each of the cold plates mounted to the CPUs 55. Moreover, between each CPU 55 and its cold plate, a temperature sensor 62 which measures the surface temperature of the CPU 55 is disposed.

On the other hand, in each dummy server 54, three ceramic heaters 56 (MS-1000 manufactured by SAKAGUCHI E.H VOC CORP.) are disposed in place of CPUs, and a cold plate is likewise mounted to each of these heaters 56. The heating medium is caused to flow through the cold plates sequentially and be released to the outside of the dummy server 54.

Moreover, in each dummy server 54, too, there are disposed temperature sensors 61 which measure the temperatures of the heating medium at the heating-medium inlet sides and outlet sides of the cold plates mounted to the heaters 56, and temperature sensors 63 which measure the temperatures of the heaters 56.

The adsorption heat pump 10 used in the test measures 450 mm×200 mm×500 mm, and the inside thereof is depressurized to around 1/100 of atmospheric pressure.

A heat exchanger measuring 120 mm×240 mm×30 mm is disposed inside each of the evaporator 11, the condenser 12, the adsorber 13a, and the adsorber 13b of the adsorption heat pump 10. A pipe (cooling-water coil pipe or heat transfer pipe) inside each heat exchanger is provided with fins at a pitch of 1 mm. Activated carbon with a particle size of 400 μm (manufactured by KUREHA CORPORATION) is filled as adsorbent inside the heat exchangers of the adsorbers 13a and 13b. Moreover, 400 g of water is filled as a cooling medium inside the adsorption heat pump 10.

By using the apparatus described above, a condition is studied under which any of the junction temperatures Tj of the CPUs 55 of the server 53 does not exceed the upper limit value (75° C.) with the loads on the CPUs 55 being set to 100%. FIG. 10 illustrates the result. Note that in FIG. 10, CPU 1 denotes the CPU disposed upstream in the direction of flow of the heating medium, and CPU 2 denotes the CPU disposed downstream in the direction of flow of the heating medium.

As be seen from FIG. 10, with the flow rate of the heating medium sets at 0.7 L/min, the junction temperature Tj of the CPU 2 exceeds the upper limit value. With the flow rate of the heating medium sets at 1.3 L/min or higher, any of the junction temperatures Tj of the CPUS 1 and 2 do not reach the upper limit value.

With the flow rate of the heating medium sets at 1.0 L/min, the temperature of the heating medium (hot water) released from the server 53 reaches the target temperature (55° C.) when the junction temperature Tj of the CPU 2 reaches the upper limit value. When this occurs, a difference ΔT in the temperature of the heating medium between the heating-medium inlet side and outlet side of the server 53 is 1.9° C., and the surface temperature of the CPU 2 is 61° C. Moreover, the time taken for the junction temperature of the CPU 2 to reach the upper limit value from when the heating medium starts to flow is approximately 1300 seconds.

Based on this result, the flow rate of the heating medium flowing into each dummy server 54 is controlled such that the difference ΔT in the temperature of the heating medium between the heating-medium inlet side and outlet side of the dummy server 54 becomes 1.9° C. Moreover, the adsorption heat pump 10 is operated with the total output of the ceramic heaters 56 being set to 460 W (Case 1), to 360 W (Case 2), and to 270 W (Case 3). FIG. 11 illustrates the conditions in these cases altogether.

Figure 12:
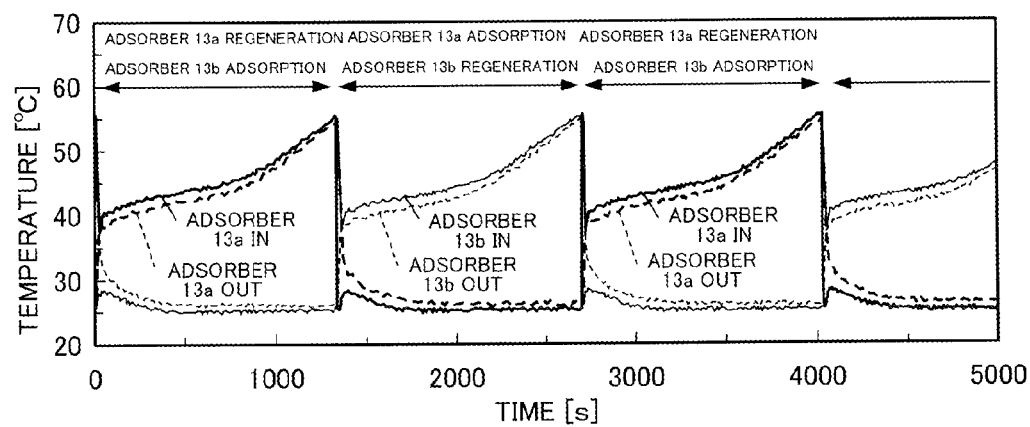
FIG. 12 is a diagram illustrating changes in the temperature of a heating medium over time at the inlet side and the outlet side of each adsorber in Case 1.

As a result, similar temperature histories are obtained in all the Cases 1 to 3. FIG. 12 illustrates changes in the temperature of the heating medium over time at the inlet side (IN) and the outlet side (OUT) of each of the adsorbers 13a and 13b in Case 1. Moreover, FIG. 13 illustrates changes in the temperature of the cooling water at the inlet side (IN) and the outlet side (OUT) of the cooling-water coil pipe 11a of the evaporator 11.

As be seen from FIG. 12, in the case of a shift from an adsorption cycle to a regeneration cycle, the cooling water supplied from the chiller unit 35 is still remaining inside the adsorber immediately after the shift to the regeneration cycle. For this reason, the temperature of the heating medium flowing through the adsorber drops immediately after the shift from the adsorption cycle to the regeneration cycle, but the temperature then gradually rises due to the heat generated by the CPUs. Thereafter, when the temperature of the heating medium flowing into the adsorber reaches the target temperature (55° C.), the adsorber operating in the regeneration cycle shifts to an adsorption cycle, whereas the adsorber operating in an adsorption cycle shifts to a regeneration cycle.

Figure 13:
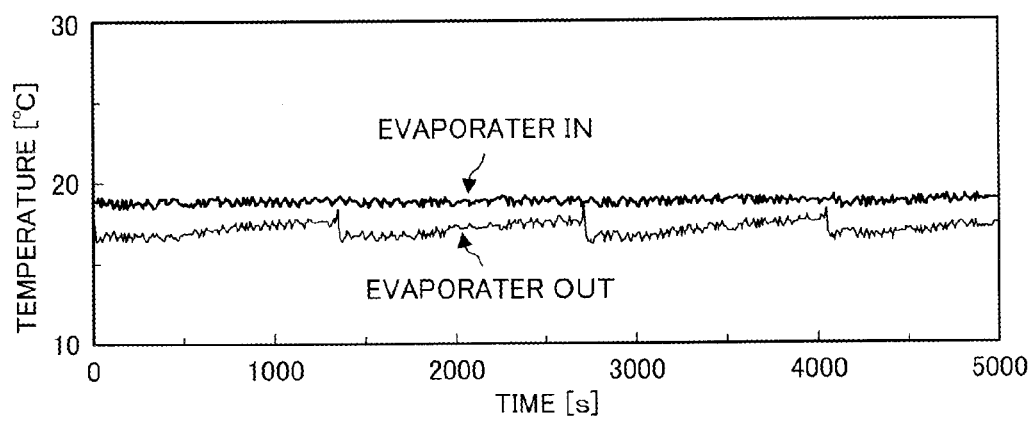
FIG. 13 is a diagram illustrating changes in the temperature of cooling water at the inlet side and the outlet side of a cooling-water coil pipe of an evaporator.

FIG. 13 indicates that a temperature difference is always present between the inlet side (IN) and outlet side (OUT) of the cooling-water coil pipe 11a of the evaporator 11 during operation in a regeneration cycle. This means that a cooling output is obtained continuously.

Figure 14A:
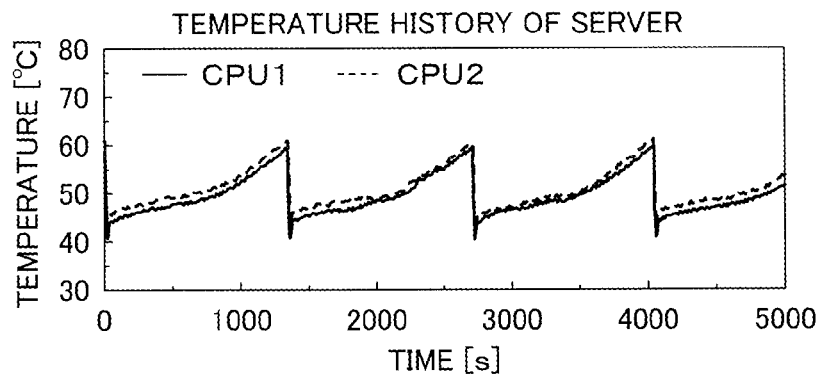
FIGS. 14A to 14C are diagrams illustrating changes in the surface temperatures of CPUs and heaters over time in Case 1.
Figure 14B:
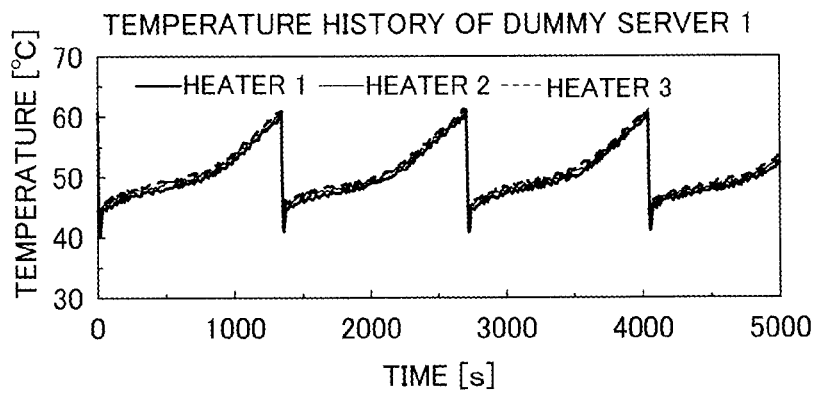
Figure 14C:
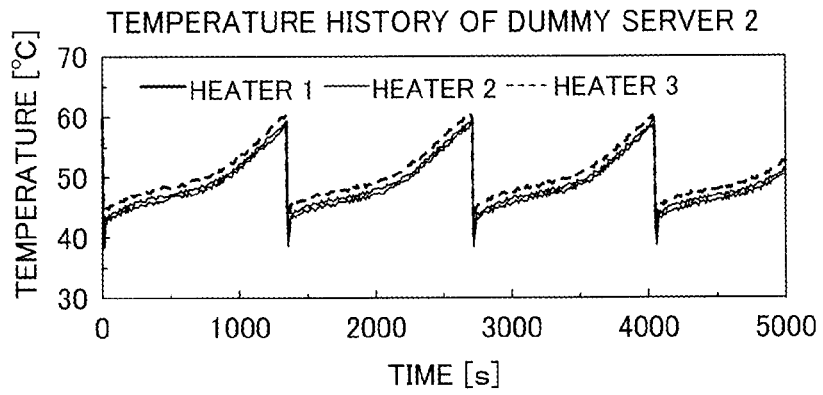

FIGS. 14A to 14C illustrate changes in the surface temperatures of the CPUs and the heaters over time in Case 1. In FIGS. 14B and 14C, among the three heaters mounted on each dummy server 54 (dummy servers 1 and 2), heater 1 denotes the heater disposed upstream in the direction of flow of the heating medium, heater 2 denotes the heater disposed at the center, and heater 3 denotes the heater disposed downstream.

FIGS. 14A to 14C indicate that each of the server and the dummy servers 1 and 2 may maintain the surface temperatures of its heat sources (CPUs or heaters) at 61° C. or below.

Figures 15, 16:
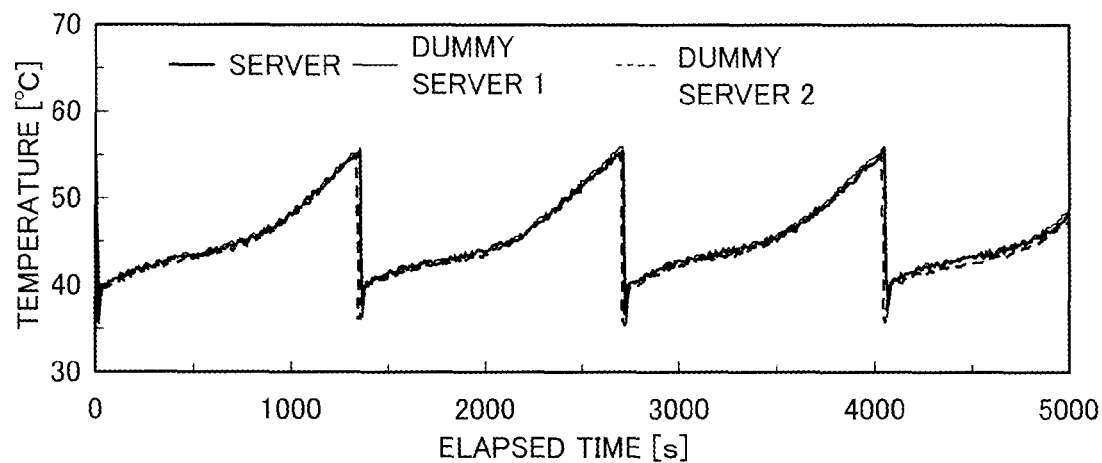
FIG. 15 is a diagram illustrating changes in the temperatures of the heating medium over time at the heating-medium outlet sides of a server and dummy servers.
FIG. 16 is a diagram illustrating the result of cooling energy generation under the condition of each of Cases 1 to 3.

FIG. 15 is a diagram illustrating changes in the temperatures of the heating medium over time at the heating-medium outlet sides of the server and the dummy servers. As illustrated in FIG. 15, the temperatures of the heating medium at the heating-medium outlet sides of the server and the dummy servers change in similar manners.

FIG. 16 is a diagram illustrating the result of cooling energy generation under the condition of each of Cases 1 to 3 mentioned above. As illustrated in FIG. 16, a cooling output is obtained under all the conditions regardless the differences in the output of the heat sources. Thus, a cooling output is stably obtained without increasing the junction temperatures above the upper limit value, even with variations in the outputs of servers (electronic devices). Moreover, the coefficients of performance (COP) in Cases 1 to 3 are 0.57 to 0.59, which are good.

The test results mentioned above indicate that the time at which the temperature of the hot water released from the electronic devices reaches the target temperature, and the time at which the CPU junction temperature Tj reaches the upper limit value will coincide with each other by operating the system under the condition in FIG. 10 where the flow rate is 1.0 L/min, i.e. under the condition where ΔT=1.9° C. This condition is stored as the aforementioned database in the control unit 30, and the opening degrees of the flow-rate adjustment valves 43a, 43b, and 43c and the amount of discharge of the pump 38 are adjusted such that the temperature difference between the heating-medium inlet side and outlet side of each electronic device becomes ΔT=1.9° C. In this way, the adsorption heat pump 10 may be operated efficiently.

Moreover, similar tests may be performed with different CPU loads, for example, and the optimal condition may be stored in the control unit 30 as a database for each CPU load. In this case, the control unit 30 may further receive data on the CPU load. In this way, the adsorption heat pump 10 may be operated more efficiently according to changes in CPU load.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of controlling an adsorption heat pump for merging a heating medium released from a plurality of electronic devices and supplying the heating medium to the adsorption heat pump, the method comprising:
providing
a flow-rate adjustment unit provided at each of inlet sides of the plurality of the electronic devices in a flow path of the heating medium and being capable of individually adjusting flow rates of the heating medium to be supplied to the plurality of electronic devices,
a temperature sensor configured to individually detect temperatures of the heating medium released from the plurality of electronic devices, and
a control unit; and
causing the control unit to control the flow-rate adjustment unit based on outputs of the temperature sensor such that the temperatures of the heating medium released from the plurality of electronic devices become equal to each other.

2. The method of controlling an adsorption heat pump according to claim 1, wherein
the adsorption heat pump includes an evaporator which converts a liquid cooling medium into a gaseous cooling medium, and a first adsorber and a second adsorber in each of which adsorbent that adsorbs the gaseous cooling medium is disposed, and
the control unit controls a switch valve each time the temperature of the heating medium to be supplied to the adsorption heat pump reaches a preset target temperature, such that the heating medium flows through each of the first adsorber and the second adsorber alternately.

3. The method of controlling an adsorption heat pump according to claim 2, wherein the control unit controls a total flow rate of the heating medium to be supplied to the plurality of electronic devices such that any of junction temperatures or surface temperatures of semiconductor components mounted on the electronic devices does not exceed a preset upper limit value.

4. The method of controlling an adsorption heat pump according to claim 3, wherein the control unit controls the total flow rate of the heating medium to be supplied to the plurality of electronic devices according to loads on the semiconductor components.

5. The method of controlling an adsorption heat pump according to claim 3, wherein the control unit controls the total flow rate of the heating medium to be supplied to the plurality of electronic devices such that any of the junction temperatures or the surface temperatures of the semiconductor components reaches the preset upper limit value when the temperature of the heating medium to be supplied to the adsorption heat pump reaches the preset target temperature.

6. An information processing system comprising:
a transfer pump configured to transfer a heating medium;
a branching portion at which a flow path of the heating medium transferred from the transfer pump branches off;
a merging portion at which the flow paths branching off at the branching portion merge together;
a plurality of electronic devices each disposed between the branching portion and the merging portion and having a heating-medium flow path through which the heating medium flows;
an adsorption heat pump to which the heating medium after the merging at the merging portion is supplied;
a flow-rate adjustment unit provided at each of inlet sides of the plurality of the electronic devices in the flow path of the heating medium and being capable of individually adjusting flow rates of the heating medium to be supplied to the plurality of electronic devices;
a temperature sensor configured to individually detect temperatures of the heating medium released from the plurality of electronic devices; and
a control unit configured to receive signals from the temperature sensor and control the flow-rate adjustment unit such that the temperatures of the heating medium released from the plurality of electronic devices become equal to each other.

7. The information processing system according to claim 6, wherein
the adsorption heat pump includes
an evaporator configured to convert a liquid cooling medium into a gaseous cooling medium, and
a first adsorber and a second adsorber in each of which adsorbent configured to adsorb the gaseous cooling medium is disposed, and
the control unit controls a switch valve each time the temperature of the heating medium after the merging at the merging portion reaches a preset target temperature, such that the heating medium flows through each of the first adsorber and the second adsorber alternately.

8. The information processing system according to claim 7, wherein the control unit controls a total flow rate of the heating medium to be supplied to the plurality of electronic devices such that any of junction temperatures or surface temperatures of semiconductor components mounted on the plurality of electronic devices does not exceed a preset upper limit value.

9. The information processing system according to claim 8, wherein the control unit controls the total flow rate of the heating medium to be supplied to the plurality of electronic devices according to loads on the semiconductor components.

10. The information processing system according to claim 8, wherein the control unit controls the total flow rate of the heating medium to be supplied to the plurality of electronic devices such that any of the junction temperatures or the surface temperatures of the semiconductor components reaches the preset upper limit value when the heating medium after the merging at the merging portion reaches the preset target temperature.

11. The information processing system according to claim 8, wherein the control unit stores therein a database containing data on loads on the semiconductor components, data on the flow rates of the heating medium flowing into the plurality of electronic devices, and data on a difference in the temperature of the heating medium between a heating-medium inlet side and outlet side of each of the plurality of electronic devices.

12. A control device of an information processing system, the information processing system including:
a transfer pump configured to transfer a heating medium;
a branching portion at which a flow path of the heating medium transferred from the transfer pump branches off;

a merging portion at which the flow paths branching off at the branching portion merge together;

a plurality of electronic devices each disposed between the branching portion and the merging portion and having a heating-medium flow path through which the heating medium flows;

an adsorption heat pump to which the heating medium after the merging at the merging portion is supplied;

a flow-rate adjustment unit capable of individually adjusting flow rates of the heating medium to be supplied to the plurality of electronic devices; and a temperature sensor configured to individually detect temperatures of the heating medium released from the plurality of electronic devices, wherein the control device receives signals from the temperature sensor and controls the flow-rate adjustment unit such that the temperatures of the heating medium released from the plurality of electronic devices become equal to each other.

13. The control device according to claim 12, wherein the control device controls a switch valve each time the temperature of the heating medium after the merging at the merging portion reaches a preset target temperature, such that the heating medium flows through each of a first adsorber and a second adsorber in the adsorption heat pump alternately.

14. The control device according to claim 13, wherein the control device controls a total flow rate of the heating medium to be supplied to the plurality of electronic devices such that any of junction temperatures or surface temperatures of semiconductor components mounted on the electronic devices does not exceed a preset upper limit value.

15. The control device according to claim 14, wherein the control device controls the total flow rate of the heating medium to be supplied to the plurality of electronic devices according to loads on the semiconductor components.

16. The control device according to claim 14, wherein the control device controls the total flow rate of the heating medium to be supplied to the plurality of electronic devices such that any of the junction temperatures or the surface temperatures of the semiconductor components reaches the preset upper limit value when the heating medium after the merging at the merging portion reaches the preset target temperature.

17. The control device according to claim 14, wherein the control device stores therein a database containing data on loads on the semiconductor components, data on the flow rates of the heating medium flowing into the plurality of electronic devices, and data on a difference in the temperature of the heating medium between a heating-medium inlet side and outlet side of each of the plurality of electronic devices.

18. The method of controlling an adsorption heat pump according to claim 2, wherein the preset target temperature is a temperature for a regeneration of adsorbents of the first adsorber and the second adsorber.

19. The information processing system according to claim 7, wherein the preset target temperature is a temperature for a regeneration of adsorbents of the first adsorber and the second adsorber.

* * * * *